United States Patent [19]

Henderson et al.

[11] Patent Number: 4,777,718

[45] Date of Patent: Oct. 18, 1988

[54] METHOD OF FORMING AND CONNECTING A RESISTIVE LAYER ON A PC BOARD

[75] Inventors: James M. Henderson, Scottsdale; Ronald F. Kielmeyer, Jr., Chandler, both of Ariz.

[73] Assignee: Motorola, Inc., Schaumburg, Ill.

[21] Appl. No.: 880,613

[22] Filed: Jun. 30, 1986

[51] Int. Cl.[4] .................. H05K 3/32; H01C 17/06
[52] U.S. Cl. ......................... 29/620; 29/830; 29/852; 338/307; 338/312; 338/314; 333/128; 361/402
[58] Field of Search .............. 333/22 R, 238, 246, 333/128; 338/216, 307, 310, 312, 319, 320, 314; 361/402; 29/610 R, 620, 832, 830, 852

[56] References Cited

U.S. PATENT DOCUMENTS

| | | | |
|---|---|---|---|
| 3,354,412 | 11/1967 | Steidlitz | 333/22 R |
| 3,423,260 | 1/1969 | Heath et al. | 361/402 X |
| 3,541,474 | 11/1970 | Holton | 333/22 R |
| 3,585,533 | 6/1971 | Denhard | 333/22 |
| 3,678,417 | 7/1972 | Ragan et al. | 333/22 R |
| 3,771,070 | 11/1973 | Gaudio | 333/238 X |
| 3,775,725 | 11/1973 | Endo | 338/307 X |
| 3,815,055 | 6/1974 | Plunk et al. | 333/238 X |
| 3,974,462 | 10/1976 | Fassett | 333/22 R |
| 4,189,691 | 2/1980 | McDonough | 333/238 X |
| 4,396,900 | 8/1985 | Hall | 338/309 |
| 4,450,418 | 5/1984 | Yum et al. | 333/128 |

FOREIGN PATENT DOCUMENTS 148506 7/1985 European Pat. Off. ............ 338/320

OTHER PUBLICATIONS

Trant, G. R.; "Microwave Stripline Packaging with UMD's"; *Microwave Journal;* Aug. 1975; pp. 49–51.

*Primary Examiner*—Eugene R. LaRoche
*Assistant Examiner*—Benny Lee
*Attorney, Agent, or Firm*—Maurice J. Jones

[57] ABSTRACT

A resistive element is formed on a printed circuit board using only printed circuit board fabrication techniques. A substrate having a bi-metallic cladding on one side of the substrate and a conductive metallic cladding on an opposing side of the substrate is used. A predetermined trace pattern is formed in the metallic cladding. Resistive elements are formed in the bi-metallic cladding opposing their desired locations in the trace pattern. The bi-metallic cladding consists of a resistive layer between the substrate and a second conductive layer. Tabs are etched in the second conductive layer, then resistors, which couple various tabs together, are etched in the resistive layer. Plated holes connect the tabs to desired locations in the trace pattern located on the opposing side of the substrate.

1 Claim, 2 Drawing Sheets

METHOD OF FORMING AND CONNECTING A RESISTIVE LAYER ON A PC BOARD

BACKGROUND OF THE INVENTION

This invention relates generally to the transmission of microwave and millimeter-wave energy. Specifically, the present invention relates to an apparatus and method for providing a resistor which is useful in microstrip, stripline, and suspended stripline transmission systems. More specifically, the present invention relates to fabricating a resistor on a printed circuit board using only conventional printed circuit board fabrication techniques.

A feed network for an antenna may contain hundreds of power dividers or other multiport devices, each of which requires a resistive element. Several conventional techniques teach constructing or coupling resistive elements in transmission systems. Although these techniques may work acceptably when only a few resistors are needed, they become impractical in large feed networks which require hundreds of these resistors.

For example, chip resistors or resistive films may reside at desired locations in the transmission system. These chip resistors or resistive films must be accurately placed and soldered or bonded to a stripline or microstrip printed circuit board to properly connect the resistive element to the transmission system. However, slight displacements, such as 0.005 inch, from an optimum position cause a degraded performance in the transmission system at higher frequencies, such as greater than 10 GHz. Thus, when hundreds of these resistors are placed in a transmission system, the probability of degraded performance from a few misplaced resistors becomes great. Furthermore, the inductance of solder joints and the effects of adhesives often degrade the performance of the transmission system, and the chip resistors may experience fracturing problems when several layers of printed circuit boards are bonded together to form a multi-layer structure.

Thick film resistors might also reside at desired locations on a printed circuit board. A silk screening operation typically deposits these thick film resistors, and the thick film resistors then cure at elevated temperatures. However, when printed circuit boards become relatively large, the silk screening technique fails to accurately place the resistive film. Additionally, the elevated temperatures used to cure the resistive film may degrade the adhesion of printed circuit traces to a dielectric substrate. Further, the thick film substance, when cured, represents a brittle bump which is subject to cracking when multiple printed circuit boards are bonded together.

Alternatively, thin film resistors may reside at desired locations of a transmission system. However, the thin film resistors require a hard substrate, such as a ceramic or quartz. Hard substrates are not practical for use with large feed networks because large feed networks require more area than is mechanically obtainable with a hard substrate. Thus, the thin film resistor technique does not adequately work for large feed networks.

A bi-metallic clad substrate may serve as a printed circuit board on which the microstrip or stripline transmission system is formed. Bi-metallic clad substrates have a thin resistive metallic layer clad to a dielectric substrate and a conductive metallic layer clad to the resistive layer. A conventional use of a bimetallic clad substrate first removes portions of the conductive metallic layer leaving a desired trace pattern for the feed network. Then, the resistive layer is etched so that resistive material remains clad to the substrate at desired locations. Unfortunately, additional portions of the resistive layer remain sandwiched between the etched conductive metallic traces and the dielectric substrate. This additional portion of the resistive layer causes significant transmission losses at higher frequencies, such as those above 10 GHz.

SUMMARY OF THE INVENTION

Accordingly, it is an object of the present invention to provide an improved resistive element that permits accurate placement of many resistors on a large printed circuit board.

Another object of the present invention concerns providing an improved resistive element that is compatible with the lamination of multiple printed circuit boards together into a multi-layer printed circuit board.

Yet another object of the present invention concerns providing an improved resistive element that minimizes losses at frequencies of greater than 10 GHz.

Still another object of the present invention concerns providing a resistive element that is suitable for usage on soft printed circuit boards.

The above and other objects and advantages of the present invention are carried out in one form by a transmission system which includes two dielectrics that reside substantially parallel to each other. Two conductive traces are formed to reside in a plane which contacts a first boundary of one of the dielectrics. Each of the two traces have first and second sections. A resistive layer resides in contact with a first boundary of the other dielectric. Finally, the present invention includes means for coupling the resistive layer to the first sections of each of the two conductive traces while preventing the resistive layer from contacting the second sections of each of the two traces.

BRIEF DESCRIPTION OF THE DRAWINGS

A more complete presentation of this invention is presented in the detailed description and claims when considered in connection with the accompanying drawings, in which like reference numbers indicate similar parts, and wherein:

DETAILED DESCRIPTION OF THE PREFERRED EMBODIMENT

Figure 1:
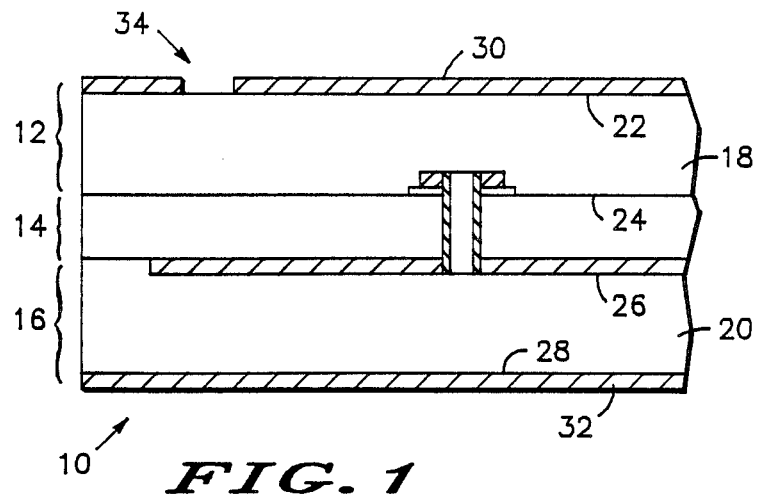
FIG. 1 shows a cross-sectional side view of a transmission system built according to the teaching of the present invention.

FIG. 1 shows a transmission system 10 built according to the teaching of the present invention. Transmission system 10 contains strata, or layers, 12, 14, and 16. Stratum 12 contains a dielectric substrate 18 having a first substantially planar boundary 22 and a second substantially planar boundary 24. First boundary 22 resides parallel to second boundary 24 and on an opposing side of dielectric 18 from second boundary 24. A conductive layer 30 resides in contact with boundary 22 of stratum 12. In the preferred embodiment conductive layer 30 represents a metallic cladding which attaches to substrate 18 at first boundary 22. Copper may advantageously serve as a suitable metal from which conductive layer 30 is constructed.

Stratum 14 resides adjacent to and substantially parallel with stratum 12. Stratum 14 contains conductive traces and at least one resistive element, as discussed below. Stratum 16 resides adjacent to and substantially parallel with stratum 14. Strata 12 and 16 reside on opposing sides of stratum 14. Stratum 16 contains a dielectric substrate 20 which has a first boundary 26 and a second boundary 28. First boundary 26 represents a substantially planar surface which resides in contact with stratum 14. Second boundary 28 represents a substantially planar surface which resides parallel to boundary 26 and on an opposing side of dielectric 20 from boundary 26. A conductive layer 32 resides substantially parallel with and adjacent to dielectric substrate 20 at boundary 28. In the preferred embodiment conductive layer 32 represents a metallic cladding, such as copper, attached to dielectric substrate 20.

In the preferred embodiment transmission system 10 serves as an antenna having a feed network. Transmission system 10 represents a multi-layer printed circuit board with strata 12, 14, and 16 representing independent layers which are laminated together. Conductive layers 30 and 32 represent top and bottom ground planes for transmission system 10. A slot 34 formed in conductive layer 30 permits electromagnetic energy to radiate into and from transmission system 10, causing transmission system 10 to operate as an antenna.

Figure 2:
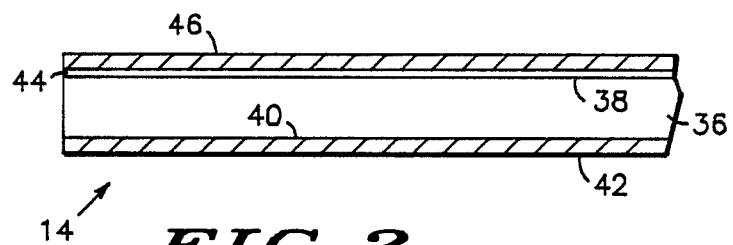
FIG. 2 shows a side view of a middle layer of the transmission system shown in FIG. 1.

FIG. 1 illustrates stratum 14 after formation of conductive traces and a resistive element. On the other hand, FIG. 2 shows stratum 14 prior to the formation of traces and the resistive element. Referring to FIG. 2, stratum 14 contains a substantially planar dielectric substrate 36 which has a first boundary 38 and a second boundary 40. First and second boundaries 38 and 40 reside substantially parallel to each other and on opposing sides of dielectric 36. A substantially planar conductive layer 42 resides parallel to and in contact with dielectric 36 at second boundary 40. Conductive layer 42 represents a metallic cladding, such as copper, which attaches to dielectric 36.

Two separate layers of diverse materials attach to dielectric 36 at first boundary 38. A relatively thin resistive metallic layer 44 resides immediately adjacent to dielectric substrate 36 at boundary 38. Resistive layer 44 represents a substantially planar surface, advantageously less than 50 micro-inches thick, which adheres at one side thereof to dielectric 36. A conductive layer 46 resides substantially parallel with and adjacent to resistive layer 44 on an opposing side of resistive layer 44 from dielectric 36. Conductive layer 46 represents a metallic conductor, such as copper, which is conventionally used in fabricating printed circuit boards. On the other hand, resistive layer 44 represents a resistive metal which exhibits a predetermined sheet resistivity value, such as 25 or 100 ohms per square. Accordingly, stratum 14 represents a bi-metallic clad substrate. Ohmega Foil Clad RT/Duroid manufactured by the Rogers Corporation represents one example of a bimetallic clad substrate. The substrate in this preferred embodiment represents a soft substrate.

Referring to both FIGS. 1 and 2, a desired conductive trace pattern is etched from conductive layer 42 while a desired pattern of resistors is etched from resistive layer 44. Then, stratum 14 is bonded to strata 12 and 16 to form a multi-layer printed circuit board which represents transmission system 10 in the preferred embodiment. Thus, transmission system 10 in the preferred embodiment represents a stripline transmission system. However, those skilled in the art will recognize that the present invention may also be applied to microstrip and suspended stripline transmission systems. For example, no restrictions are placed on the thickness of dielectric substrates 18, 20, and 36. Further, dielectrics 18, 20, and 36 need not be constructed from like materials. In fact, air serves as dielectrics 18 and 20 in a suspended stripline application.

Figure 3:
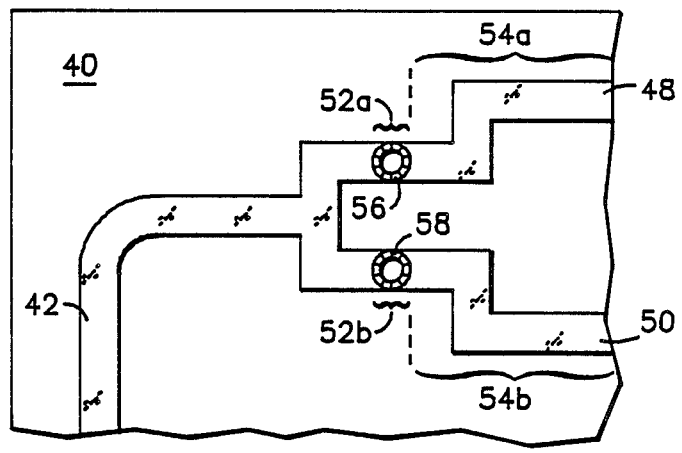
FIG. 3 shows a bottom view of the middle layer shown in FIG. 2.
Figure 4:
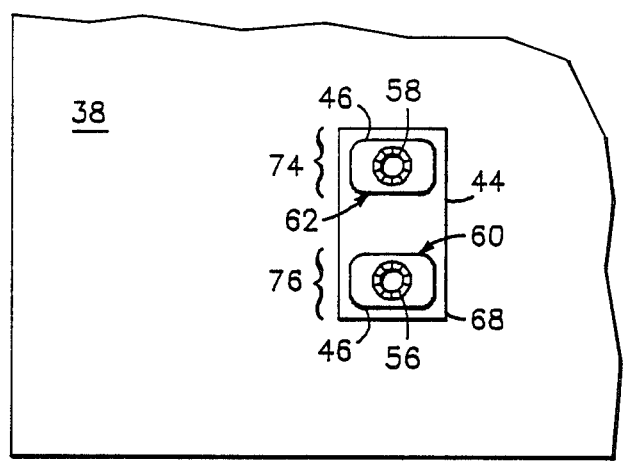
FIG. 4 shows a top view of the middle layer shown in FIG. 2.
Figure 5:
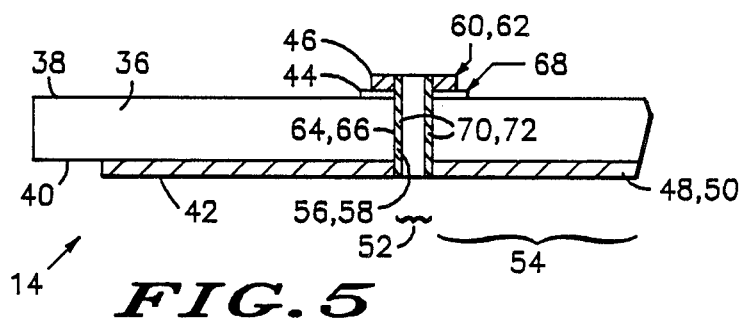
FIG. 5 shows a sectional side view of the middle layer shown in FIG. 2 taken after completion of an etching process.

FIGS. 3–5 describe formation of conductive traces and resistive elements on stratum 14 of transmission system 10. FIG. 3 shows conductive layer 42 and boundary 40 of stratum 14 after traces have been formed by removing unwanted portions of layer 42. The pattern of traces, which conductive layer 42 forms after etching, is constructed by chemical etching using conventional techniques known to those skilled in the art of fabricating printed circuit boards.

The preferred embodiment shown in FIG. 3 represents a Wilkinson power divider. Accordingly, one common trace splits into two separate traces. The two separate traces are labeled trace 48 and trace 50 in FIG. 3. Traces 48 and 50 provide separate channels which are to be isolated from each other using a resistive element. Trace 48 contains a coupled section 52a and a non-coupled section 54a. Likewise, trace 50 contains a coupled section 52b and a non-coupled section 54b. For optimum performance of the Wilkinson power divider, a resistive element connects with traces 48 and 50 at sections 52, and not at sections 54. The location of sections 52 may be determined by one skilled in the art, and sections 54 are defined so that they represent portions of traces 48 and 50 that do not reside within sections 52.

FIG. 4 shows a view of first boundary 38 of stratum 14. FIG. 4 depicts stratum 14 after an etching process has occurred. Two separate etching steps must occur to transform stratum 14 as shown in FIG. 2 into the etched stratum 14 shown in FIG. 4. First, a conventional etching process removes unwanted portions of conductive layer 46. Only pads 60 and 62 from conductive layer 46 remain after this first step. Conductive pads 60 and 62 reside distally from layer 42, directly opposing sections 52a and 52b, respectively (see FIG. 3). In other words, pads 60 and 62 reside in contact with imaginary lines (not shown) that are perpendicular to the plane of traces 48 and 50 and which intersect sections 52a and 52b, respectively. The etching of layer 46 may occur simultaneously with the etching of layer 42 (see FIG. 3).

A second step, performed after the etching of layer 46, removes portions of resistive layer 44 by chemical etching. The chemicals used in etching layer 46 differ from the chemicals used in etching layer 44. Thus, the etching of layer 46 does not remove a significant portion of resistive layer 44, and the etching of resistive layer 44 does not remove a significant portion of the previously etched layer 46.

The portions of resistive layer 46 that remain on boundary 38 of stratum 14 form resistive elements, such as a resistive element 68. Resistive element 68 resides on boundary 38 of stratum 14 between pads 60 and 62, on one side of resistive element 68, and boundary 38, on the other side of resistive element 68. Resistive element 68 contains a first area 76 which contains first pad 60, and a second area 74, which contains second pad 62. Thus, pads 60 and 62 couple together only through resistive element 68. A particular geometry most advantageously used for resistive element 68 depends upon the impedance of traces 48 and 50 (see FIG. 3) and upon the resistivity of resistive layer 44. Those skilled in the art can design a shape for resistive element 68 so that a predetermined resistance exists between pads 60 and 62.

After etching resistive layer 44, conductors 56 and 58 provide electrical paths between pads 60 and 62, respectively, at first ends of conductors 56 and 58 to sections 52a and 52b (see FIG. 3), respectively, at second ends of conductors 56 and 58. Pads 60 and 62 contact resistive element 68. Thus, resistive element 68 electrically couples between separate channels 48 and 50 of the Wilkinson power divider at sections 52a and 52b. Further, the present invention exhibits an accuracy in locating resistive element 68 relative to sections 52a and 52b which can be obtained through conventional printed circuit board fabrication techniques. Such an accuracy is typically less than ±0.003 of an inch even on soft substrates having a relatively large surface area.

Figure 6:
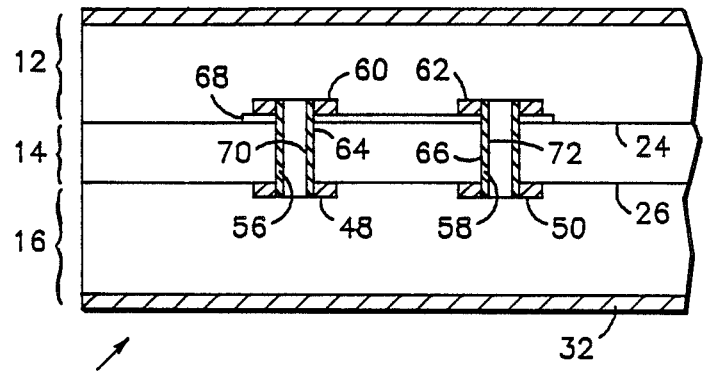
FIG. 6 shows a sectional side view of the transmission system shown in FIG. 1 taken perpendicular to the side view of FIG. 1.

FIG. 5 shows a sectional side view of stratum 14 after conductors 56 and 58 have been installed. FIG. 6 shows a sectional side view of transmission system 10 that is taken perpendicular to the FIG. 1 view of transmission system 10. In the present embodiment, conductors 56 and 58 represent plated holes. Thus, as shown in FIGS. 5 and 6, holes are formed through conductive layer 46 at pads 60 and 62, through resistive layer 44 at resistive element 68, through first boundary 38, dielectric substrate 36, second boundary 40, and first conductive layer 42 at traces 48 and 50. As discussed above, contact is made with traces 48 and 50 at sections 52, but contact is prevented at sections 54 of traces 48 and 50. Hole walls 64 and 66 form as a result. Conductive platings 70 and 72 are plated to walls 64 and 66, respectively, using conventional printed circuit board fabrication techniques. Platings 70 and 72 make physical and electrical contact with pads 60 and 62, respectively, and with traces 48 and 50, respectively. Thus, in the preferred embodiment plated holes are used as conductors 56 and 58.

As a final step, after conductors 56 and 58 are installed in stratum 14, stratum 14 is bonded, or laminated, with strata 12 and 16 to form a stripline transmission system. Conventional multi-layer printed circuit fabrication techniques are used in bonding strata 12, 14, and 16 together. This bonding technique utilizes pressure which may cause the boundaries between strata 12, 14, and 16 to slightly deform away from a perfectly planar surface, but each of these boundaries nevertheless remains substantially planar. Consequently, traces 48 and 50 contact boundary 26 of stratum 16 and resistive element 68 contacts boundary 24 of stratum 12.

The foregoing description uses a preferred embodiment to illustrate the present invention. However, those skilled in the art will recognize that changes and modifications may be made in this embodiment without departing from the scope of the present invention. For example, one of ordinary skill in the art would recognize that the particular Wilkinson power divider device which has been used to illustrate the preferred embodiment may be replaced with other multiple port devices which require a resistor connection thereto either for isolation, loading, or termination. In such situations, one or more of conductive trace 48 and 50 may resemble pads rather than traces. Those skilled in the art will recognize that no substantial distinction exists between pads and traces, and that any distinction between pads and traces made herein is presented merely to ease understanding of the present invention. Furthermore, the multi-layer printed circuit board technique described in the preferred embodiment which achieves a stripline transmission system may be modified using techniques known to those skilled in the art to cause transmission system 10 to exhibit the properties consistent with a microstrip transmission system, or a suspended stripline transmission system. These and other modifications obvious to those skilled in the art are intended to be included within the scope of this invention.

We claim:

1. A method of fabricating a resistor on a printed circuit board having a first conductive layer contacting a first side of a dielectric substrate, a first side of a resistive metal layer contacting a second side of the dielectric substrate, and a second conductive layer contacting a second side of the resistive metal layer, said method comprising the steps of:

forming first and second traces from the first conductive layer, the first and second traces each having a coupling section;

forming first and second pads from the second conductive layer, the first and second pads opposing the coupling sections of the first and second traces, respectively;

making a first hole through the coupling section of the first trace, the substrate, the resistive layer, and the first tab to provide a first hole wall;

making a second hole through the coupling section of the second trace, the substrate, the resistive layer, and the second tab to provide a second hole wall;

plating the first and second hole walls so that first and second conductive paths form between the first pad and first trace and between the second pad and second trace, respectively;

removing portions of the resistive metal layer which do not reside between the first and second pads;

bonding a second printed circuit board, having a dielectric substrate with first and second substantially parallel sides and having a conductive layer contacting the first side of the second circuit board substrate, to the printed circuit so that the second side of the second printed circuit substrate resides adjacent to the second side of the printed circuit substrate; and bonding a third printed circuit board, having a dielectric substrate with first and second substantially parallel sides and having a conductive layer contacting the first side of the third circuit board substrate, to the printed circuit so that the second side of the third circuit board substrate resides adjacent to the first side of the printed circuit substrate.

* * * * *